US006937007B1

(12) United States Patent
Ruether et al.

(10) Patent No.: US 6,937,007 B1
(45) Date of Patent: Aug. 30, 2005

(54) MAGNET FIELD SYMMETRY FOR HALL SENSOR

(75) Inventors: David J. Ruether, Maple Grove, MN (US); Joseph J. Schottler, Crystal, MN (US)

(73) Assignee: Sauer-Danfoss Inc., Minneapolis, MN (US)

( * ) Notice: Subject to any disclaimer, the term of this patent is extended or adjusted under 35 U.S.C. 154(b) by 124 days.

(21) Appl. No.: 10/408,490

(22) Filed: Apr. 7, 2003

(51) Int. Cl.[7] ........................ G01N 27/74; G01R 33/12
(52) U.S. Cl. ....................... 324/205; 324/202; 335/302
(58) Field of Search ................................ 324/205, 202; 361/148; 29/603.13, 607; 148/101; 335/296, 335/297, 302, 304

(56) References Cited

U.S. PATENT DOCUMENTS

| | | | | | |
|---|---|---|---|---|---|
| 3,609,611 | A | * | 9/1971 | Pamell | 335/284 |
| 4,465,975 | A | * | 8/1984 | Porter | 324/205 |
| 4,578,663 | A | * | 3/1986 | Sanders et al. | 335/306 |
| 4,782,293 | A | * | 11/1988 | Steingroever et al. | 324/205 |
| 4,972,284 | A | * | 11/1990 | Smith et al. | 360/327.1 |
| 4,987,508 | A | * | 1/1991 | Smith | 360/327.23 |
| 4,994,742 | A | * | 2/1991 | Lowther | 324/251 |
| 5,055,812 | A | * | 10/1991 | Abele et al. | 335/210 |
| 5,416,457 | A | * | 5/1995 | Nakatsuka et al. | 335/302 |
| 5,757,100 | A | | 5/1998 | Burgbacher | |
| 6,724,184 | B1 | * | 4/2004 | Marx et al. | 324/205 |
| 2003/0107366 | A1 | * | 6/2003 | Busch et al. | 324/202 |

OTHER PUBLICATIONS

Richard Fowler, Electricity: Principles and Applications, 4th Ed. 1994, Glencoe Division of Macmillan/McGraw-Hill, p. 150.*

* cited by examiner

*Primary Examiner*—Edward Lefkowitz
*Assistant Examiner*—Kenneth J Whittington

(57) ABSTRACT

A method for balancing the flux density of a permanent magnet includes sensing flux density in a permanent magnet and if unbalanced relative to a physical center, adjusting the cross-sectional area and shape of the magnet by removing magnetic material from the magnetic pole with the stronger magnetic flux density. This method is repeated until the magnetic flux density is balanced between the opposite poles of the permanent magnet relative to the physical center.

3 Claims, 3 Drawing Sheets

MAGNET FIELD SYMMETRY FOR HALL SENSOR

BACKGROUND OF THE INVENTION

The present invention relates to balancing permanent magnets for use as a control input for a Hall effect sensing device. In general, a Hall effect sensing device senses the intensity of a magnetic field at a particular point in space. The intensity of the magnetic field is the flux density of the magnetic field.

The flux density produced by a magnet at a particular point in space is affected by numerous factors, including magnet length, shape, material, and cross sectional area. In order to accurately indicate the position of a control input magnet within a Hall effect sensor device, it is important that the magnet have a predictable magnetic flux density from pole to pole. In our application the predictability only requires them to be symmetrically balanced. This balancing is most necessary where the control input magnet is in a null or non-indicating position relative to the device sensors. Variance in the magnetic flux density from pole to pole while in the null position may give an erroneous reading indicating a false or moved position of the magnetic control input.

It is therefore a principal object of this invention to provide a method of balancing the magnetic flux density of a permanent magnet.

These and other objects will be apparent to those skilled in the art.

BRIEF SUMMARY OF THE INVENTION

A method of balancing the magnetic flux density on a permanent magnet includes defining a physical center on the magnet, operatively aligning the magnet with a plurality of Hall effect sensors, sensing the magnetic flux density along the magnet, and selectively removing a portion of the magnetic material from the side where the pole of the magnet with the greatest magnetic flux density thereby changing both the overall shape and the localized cross-sectional area. This process continues until the magnetic flux density of the permanent magnet is balanced between the two magnetic poles with respect to the defined center.

DETAILED DESCRIPTION OF THE PREFERRED EMBODIMENT

The present invention will be described as it applies to its preferred embodiment. It is not intended that the present invention be limited to the preferred embodiment. It is intended that the invention cover all modifications and alternatives that may be included within the spirit and scope of the invention.

Figure 1:
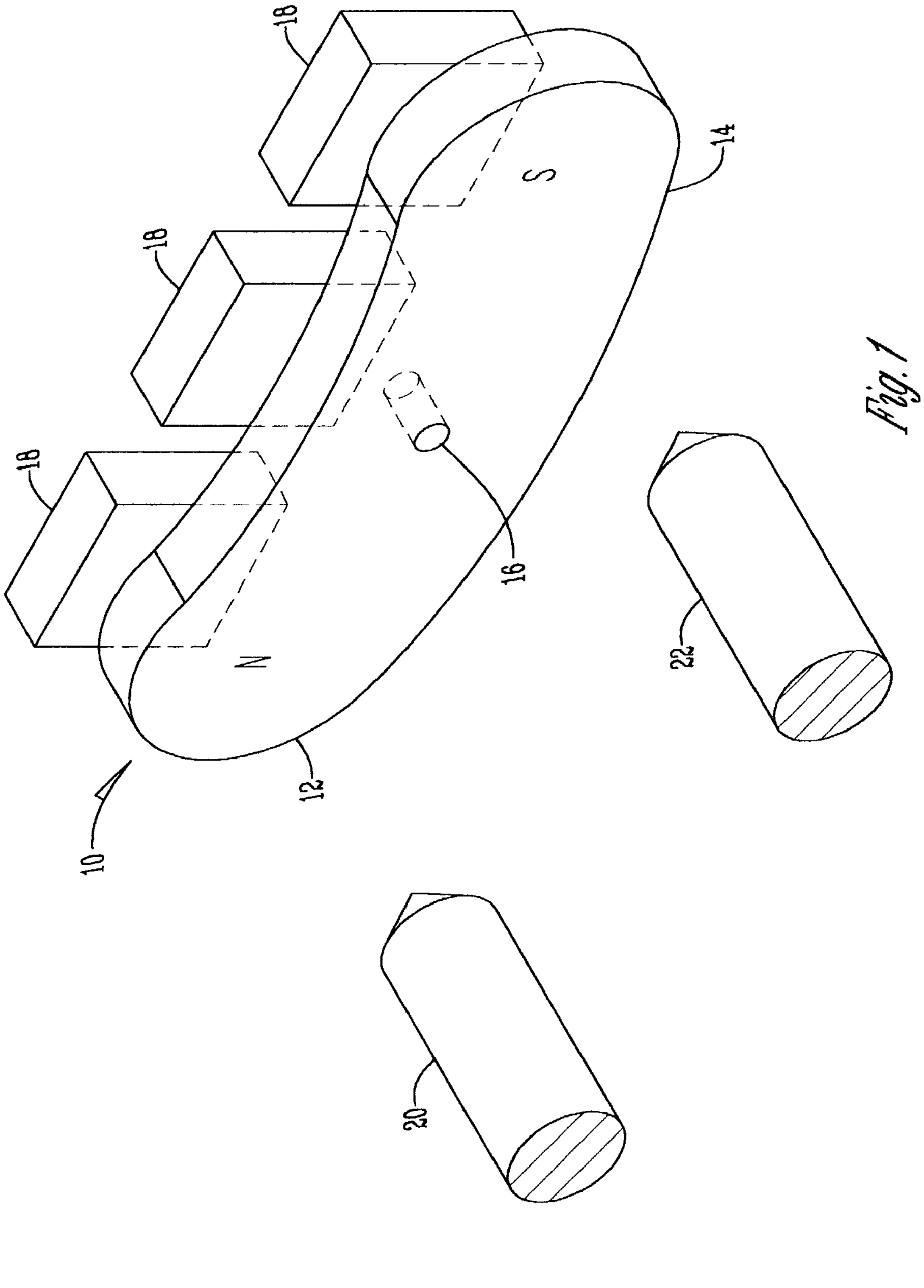
FIG. 1 is a perspective view of the elements in this invention.
Figure 2:
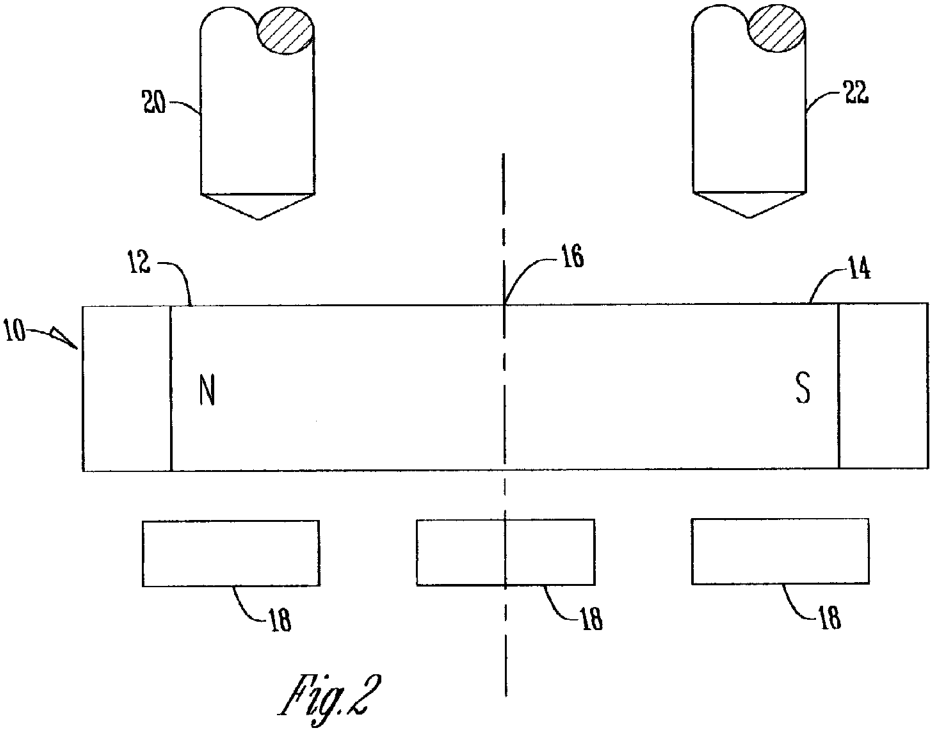
FIG. 2 is a top central longitudinal cross-sectional view of the elements of this invention.
Figure 3:
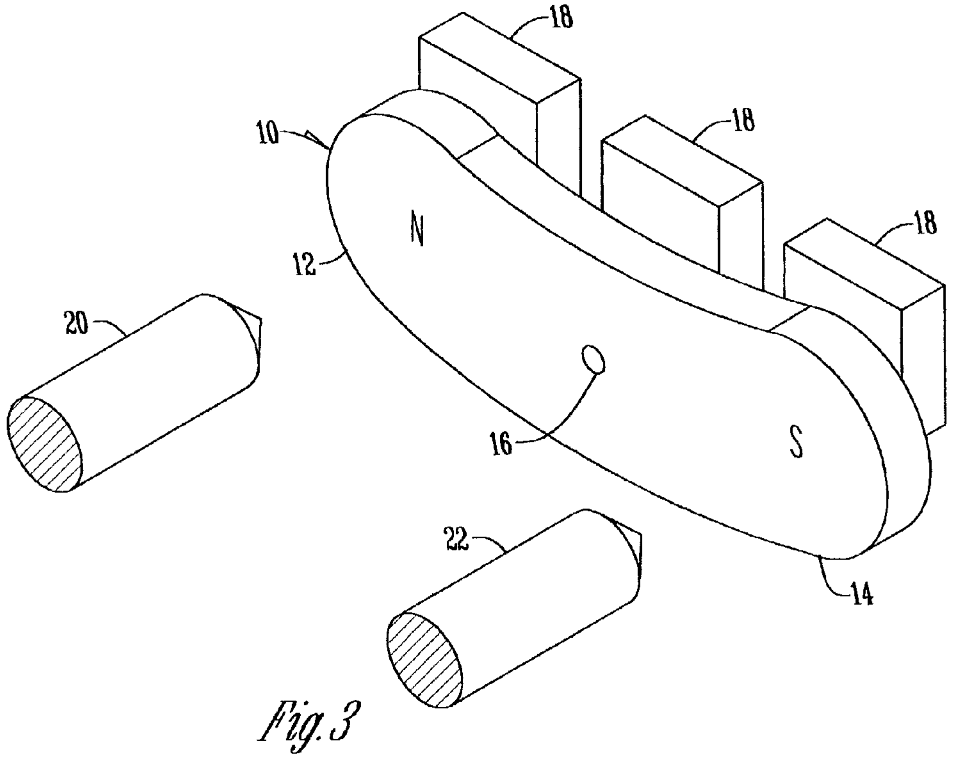
FIG. 3 is a perspective view of the elements of this invention showing specifically an example of an area of removal of material.
Figure 4:
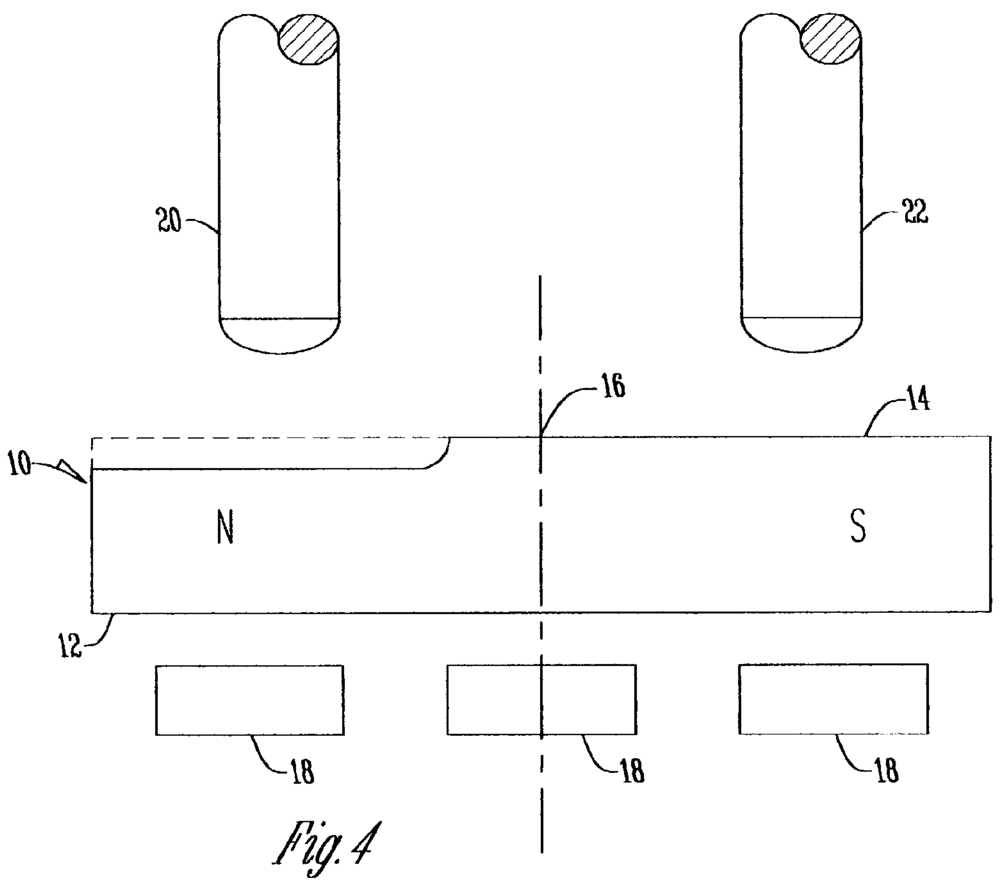
FIG. 4 is a top central longitudinal cross-sectional view of the elements of this invention showing specifically an example of an area of removal of material.

Referring to FIGS. 1–3, there is shown a first embodiment of a method for magnetic flux balancing a permanent magnet. A permanent magnet 10 is shown generally in FIGS. 1–3. The magnet has North and South opposite and opposing magnetic poles 12 and 14 respectively, with a physical center 16 that is physically defined in the structure of the magnet such as by a hole, transverse axle, indentation, or other suitable physical indication. The magnet 10 is mounted in a conventional manner such that a plurality of hall effect sensors 18 are aligned along one side of the magnet 10 in equidistant pairs radiating distally from the physical center 16.

A sensor reading is taken by the Hall effect sensors 18 to determine the magnetic flux density of various points on the permanent magnet. The reading of the magnet by the Hall effect sensors is made by standard methods. If one magnetic pole 12 or 14 of the magnet 10 is determined to have stronger magnetic flux density than the other pole 12 or 14, a planing tool 20 or 22 is applied to the stronger flux pole to remove a small amount of material from that pole. After the removal of the material, the magnet 10 is again tested, and another Hall effect sensor 18 reading is taken, and process of identifying the stronger flux pole 12 or 14 and removing material is repeated until the Hall effect sensor reading indicates that the magnetic flux densities of the two magnetic poles 12 and 14 is balanced to within a pre-determined degree or variance.

In a second embodiment, greater accuracy of the testing Hall effect sensors 18 may be obtained by moving the permanent magnet 10 within the sensing range of the sensors.

The permanent magnet 10, having been magnetically balanced, is then ready for conventional installation as an input device for a Hall effect sensor in a switch in a joystick controlling heavy equipment.

In application, the balanced magnet is installed as the magnetic control input in a control device on a joystick controlling heavy machinery. The magnet is installed as a control input in a mass produced control device. Balancing of the magnetic flux density in such application is important so that the control device will be stable in the null position, or the position where there should be no movement. An unbalanced magnet inherently creates a danger that the sensors in the control device will interpret the unbalanced condition of the magnet to be an indication of that the control device is in a non-null or moving position. The result from this type of false reading could be to move the heavy equipment when it should be at rest. By using consistently balanced permanent magnets in the control devices in this application, an operator is assured of a consistent reading of the magnet by the control device to correctly indicate the proper position of the control input magnet, particularly when the control device should indicate the null or non-moving position.

Whereas the invention has been shown and described in connection with the preferred embodiments thereof, it will be understood that many modifications, substitutions, and additions may be made which are within the intended broad scope of the following claims. From the foregoing, it can be seen that the present invention accomplishes at least all of the stated objectives.

It is therefore seen that this invention will achieve at least all of its stated objectives.

What is claimed is:

1. A method of calibrating symmetry of an elongated permanent magnet having opposite ends and opposite poles, comprising, sensing the magnetic flux along the length of the magnet;

comparing the intensity of the sensed magnetic flux to determine variations therein along the length of the magnet; and planing away the portions of the magnet adjacent areas of higher magnet flux to bring such areas into a level of magnetic flux equal to areas of lower flux to establish a more uniform magnetic flux intensity along the length of the magnet.

2. The method of claim 1 wherein the sensing is accomplished via a plurality of Hall sensors positioned adjacent the magnet.

3. The method of claim 2 wherein the magnet is moved with respect to the Hall sensors to sense the magnetic flux along the length of the magnet.

* * * * *